United States Patent
Ogasawara et al.

(10) Patent No.: US 8,678,739 B2
(45) Date of Patent: Mar. 25, 2014

(54) CARRIER SUPPORTING APPARATUS

(75) Inventors: Ikuo Ogasawara, Nirasaki (JP); Yoshiyasu Kato, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 1077 days.

(21) Appl. No.: 11/628,843

(22) PCT Filed: Jun. 20, 2005

(86) PCT No.: PCT/JP2005/011255
§ 371 (c)(1),
(2), (4) Date: Jan. 22, 2009

(87) PCT Pub. No.: WO2006/001246
PCT Pub. Date: Jan. 5, 2006

(65) Prior Publication Data
US 2009/0245979 A1    Oct. 1, 2009

(30) Foreign Application Priority Data
Jun. 29, 2004 (JP) ................................ 2004-191402

(51) Int. Cl.
*B65G 65/00* (2006.01)
(52) U.S. Cl.
USPC .......................................... 414/811; 414/938
(58) Field of Classification Search
USPC ......... 414/217, 217.1, 222.01, 403, 404, 411, 414/416.01, 416.03, 935, 937, 938, 940, 414/416.02
See application file for complete search history.

(56) References Cited

U.S. PATENT DOCUMENTS 3,902,615 A * 9/1975 Levy et al. ............... 414/331.17
5,183,370 A * 2/1993 Cruz ......................... 414/416.03
(Continued)

FOREIGN PATENT DOCUMENTS

| JP | 11-233998 | 8/1999 |
| JP | 2001-284838 | 10/2001 |
| JP | 2002-261145 | 9/2002 |
| JP | 2003-309165 | 10/2003 |

OTHER PUBLICATIONS

PCT Notification of Transmittal of Translation of the International Preliminary Examination Report (Form PCT/IB/338) dated Jan. 2004.

(Continued)

*Primary Examiner* — Saul Rodriguez
*Assistant Examiner* — Glenn Myers
(74) *Attorney, Agent, or Firm* — Smith, Gambrell & Russell, LLP

(57) ABSTRACT

A carrier supporting apparatus is configured to support a carrier containing a plurality of plate-like objects to be processed, such that each object to be processed is arranged vertically at an interval in a horizontal attitude. The carrier includes multiple sets of supporting stages each arranged vertically at an interval, wherein each set of the supporting stages are configured to support the periphery of a bottom face of one object to be processed. The carrier supporting apparatus comprises a placing table adapted to place the carrier thereon, a lifting member that can be raised and lowered relative to the placing table, and a drive mechanism adapted to drive the lifting mechanism. When raised, the lifting member raises a bottom face of the object to be processed, which is supported on a set of the lowermost supporting stages in the carrier, and lifts it up from the supporting stages.

5 Claims, 3 Drawing Sheets

(56) References Cited

U.S. PATENT DOCUMENTS

| | | | |
|---|---|---|---|
| 5,275,521 A * | 1/1994 | Wada | 414/404 |
| 5,626,456 A * | 5/1997 | Nishi | 414/404 |
| 5,697,748 A * | 12/1997 | Somekh et al. | 414/217 |
| 5,888,048 A * | 3/1999 | Martin et al. | 414/804 |
| 5,989,346 A * | 11/1999 | Hiroki | 118/719 |
| 6,337,257 B1 * | 1/2002 | Toyosawa | 438/459 |
| 6,641,348 B1 * | 11/2003 | Schultz et al. | 414/217 |
| 6,676,356 B2 * | 1/2004 | Saeki et al. | 414/217 |
| 6,814,507 B2 * | 11/2004 | Inagaki | 396/571 |
| 6,852,608 B2 * | 2/2005 | Kitamura et al. | 438/464 |
| 2002/0044859 A1 * | 4/2002 | Lee et al. | 414/411 |
| 2003/0002961 A1 * | 1/2003 | Davis et al. | 414/217.1 |
| 2004/0197174 A1 * | 10/2004 | Van Den Berg | 414/404 |

OTHER PUBLICATIONS

PCT International Preliminary Report on Patentability (Form PCT/IPEA/409) dated Apr. 2005 (English translation).

* cited by examiner

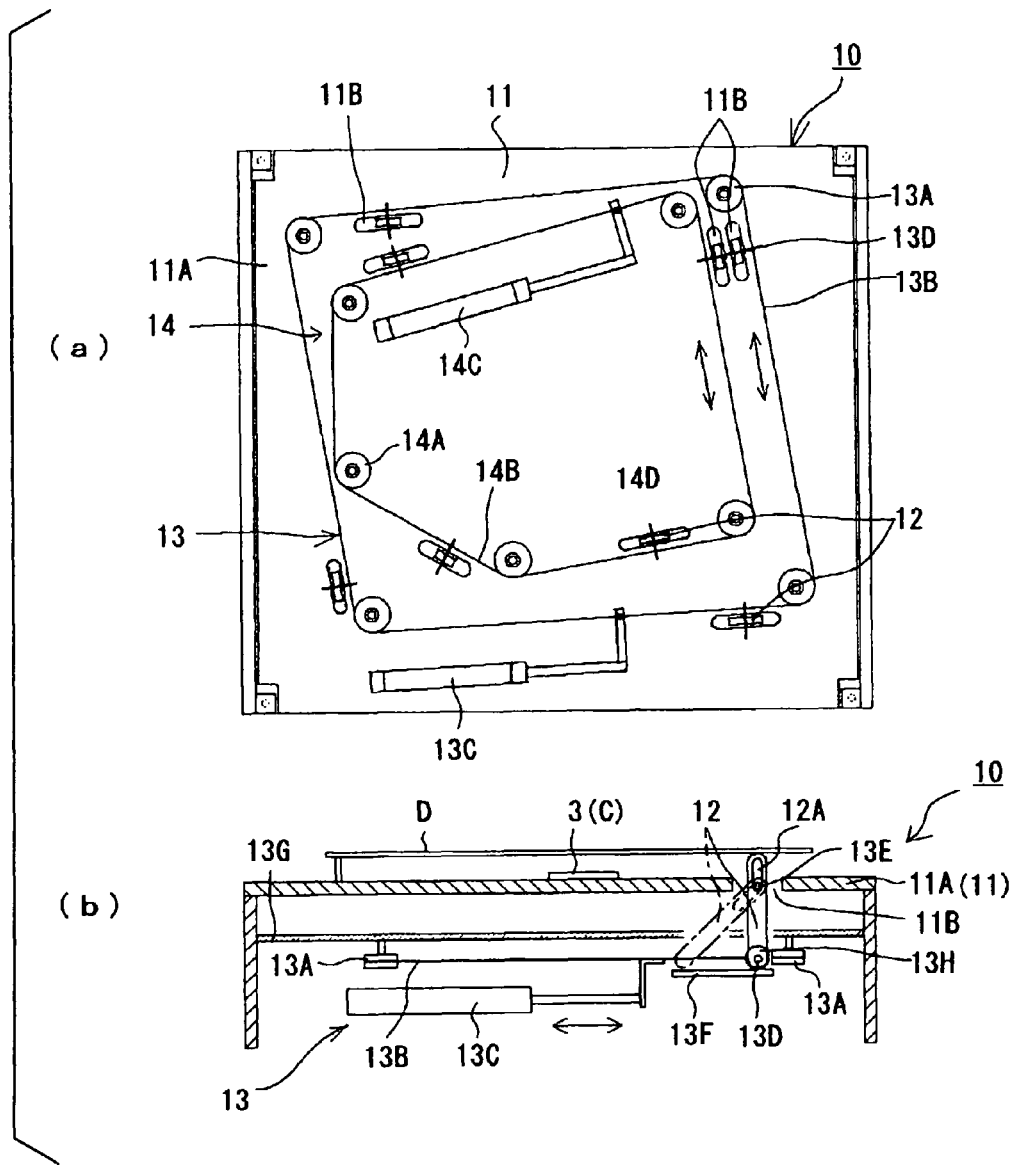
F I G. 1

CARRIER SUPPORTING APPARATUS

BACKGROUND OF THE INVENTION

1. Field of the Invention

The present invention relates to a carrier supporting apparatus for supporting a carrier containing, therein, a plurality of substantially plate-like objects to be processed, for example, semiconductor wafers, such that each wafer is arranged vertically at an interval in a horizontal attitude.

2. Background Art

For example, in the case of carrying out a test for a semiconductor wafer by using a testing device, such as a probe, the wafer is carried out from a carrier and then carried into the testing device, by using a carrying arm, so as to perform the test without providing any adjustment to the wafer. In this case, the wafer itself is not cut into individually separated chips, but all chips to be subjected to a cutting process will remain integrally to collectively constitute the wafer.

In some cases, the semiconductor wafer is attached to a film and a test is carried out for the wafer while the film is supported by a dicing frame around the wafer. (Hereinafter, the wafer, film and dicing frame in such a state as describe above will be collectively referred to as "an object to be processed", and, for convenience, such an object to be processed will also be simply referred to as "a dicing frame"). In this case, the wafer associated with the dicing frame is typically fixed onto the film while cut (or diced) into individual chips. Upon testing, for example, 25 sheets, of dicing frames are placed, in advance, in an exclusive carrier while they are each arranged vertically in the carrier at an interval, taking a horizontal attitude. Thereafter, the carrier is placed on a carrier supporting apparatus located adjacent a testing device. In this way, each dicing frame is carried between the carrier and the testing device by using a carrying arm.

For example, as shown in FIG. 3, a carrier C used exclusively for the dicing frames has a pair of left and right side plates 1, 1, and a plurality of connecting rods 2 for connecting top ends of the side plates 1, 1 together. The carrier C also includes at least one guide rod 3 for connecting bottom ends of the side plates 1, 1 together. The guide rod 3 is composed of a flat bar 3A and a piece of projection 3B formed along a bottom face of the flat bar 3A. The carrier C is positioned and placed at a predetermined location on a carrier supporting apparatus via the projection 3B of the guide rod 3.

A typical example of the carrier C has 25 sets of supporting stages 1A, 1A provided vertically at an interval. Each set of the supporting stages 1A, 1A are configured to support left and right edges at a bottom face of each one dicing frame D. Specifically, in an inner face of each side plate 1, 25 grooves 1A are provided vertically at an interval. The bottom face of each groove 1A constitutes each supporting stage.

Upon placing the dicing frames D in the carrier C, each dicing frame D supported by the carrying arm 20 is inserted horizontally between one set of grooves 1A, 1A, and thereafter the carrying arm is lowered. In this manner, the dicing frame D is supported on each supporting stage which is a bottom face of the one set of grooves 1A, 1A, in which the dicing frame D is inserted. Upon taking out each dicing frame D from the carrier C, the carrying arm 20 is inserted below a targeted dicing frame D, and is then lifted upward, thereby to raise the dicing frame D from the supporting stages 1A, 1A. Thereafter, the dicing frame D is pulled out from the carrier C while being supported by the carrying arm 20.

In the carrier C described above, as shown in FIG. 3(b), a gap $\delta 1$ (e.g., 3.49 mm) between the lowermost stages (i.e., bottom faces of the lowermost grooves 1A) and a top face of the flat bar 3A of the guide rod 3 is narrower than a gap $\delta 2$ (e.g., 4.85 mm) between each adjacent pair of the supporting stages. In addition, the former gap $\delta 1$ is slightly larger than a thickness T (e.g., 2.50 mm) of the carrying arm. Therefore, upon taking out the lowermost dicing frame D, the final gap ($\delta 1$-T) to be defined between the dicing frame D and guide rod 3 and the carrying arm 20 is significantly small (which is, for example, 3.49−2.50=0.99 mm). Therefore, the control of the carrying arm 20 is very difficult, and there is a risk of damaging the carrying arm 20 and/or dicing frame D. Accordingly, it is virtually impossible to support and carry out the lowermost dicing frame D by using the carrying arm 20.

As such, although the carrier C, apparently, has a capacity for containing 25 sheets of dicing frames D therein, the lowermost supporting stages 1A, 1A have not been used in the past, and only 24 sheets of dicing frames D were contained in the carrier C. Thus, the storage efficiency of the carrier C for the dicing frames D has been insufficient.

SUMMARY OF THE INVENTION

Therefore, it is an object of the present invention to provide a carrier supporting apparatus for supporting a carrier containing, therein, a plurality of substantially plate-like objects to be processed, such as dicing frames, such that each dicing frame is arranged vertically at an interval in a horizontal attitude, wherein even a lowermost object to be processed in the carrier can also be supported and carried out by using a carrying arm.

In order to achieve the object above, the present invention is a carrier supporting apparatus for supporting a carrier containing, therein, a plurality of substantially plate-like objects to be processed, such that each object to be processed is arranged vertically at an interval in a horizontal attitude, the carrier including multiple sets of supporting stages each arranged vertically at an interval, and each set of the supporting stages being configured to support the periphery of a bottom face of each one object to be processed, wherein the carrier supporting apparatus comprises:

a placing table adapted for placing the carrier thereon;

a lifting member provided such that the lifting member can be raised and lowered relative to the placing table and such that, when raised, the lifting member can raise the bottom face of the object to be processed, which is supported on the set of the lowermost supporting stages in the carrier, and lift up the bottom face from the supporting stages; and a drive mechanism adapted to drive the lifting member to be raised and lowered.

According to this carrier supporting apparatus, a bottom face of the lowermost dicing frame supported on the lowermost stages in the carrier can be raised and lifted up from the supporting stages, due to the lifting member which is driven to be raised and lowered by the drive mechanism. Thus, a sufficient gap for inserting the carrying arm therein can be secured under the lowermost dicing frame. Accordingly, even the lowermost dicing frame in the carrier can also be supported and carried out securely by using the carrying arm, without causing the carrying arm and/or the dicing frame to be damaged.

In one embodiment, the placing table has an upper plate having an opening formed therein, and the lifting member is configured to be raised and lowered through the opening of the upper plate.

In this case, it is preferred that an elongated hole is formed in the lifting member, and a shaft member extending through the elongated hole and adapted to guide the lifting member is fixed to the upper plate.

It is preferred that the carrier supporting apparatus according to the present invention comprises a plurality of lifting members, and that the drive means includes:

an endless belt, to which each lifting member is connected, and a cylinder mechanism connected to the belt.

Typically, the object to be processed comprises a semiconductor wafer, a film onto which the wafer is attached, and a dicing frame for supporting the film around the wafer.

BRIEF DESCRIPTION OF THE DRAWINGS

FIG. 1 is a diagram schematically showing one embodiment of a carrier supporting apparatus according to the present invention, wherein FIG. 1(a) is a plan view showing an internal mechanism in a perspective, and FIG. 1(b) is a longitudinal cross section thereof.

FIG. 3 is a diagram showing a typical carrier exclusively used for the dicing frames, wherein FIG. 3(a) is a front view, FIG. 3(b) is an enlarged view of a portion B of FIG. 3(a) in which a dicing frame is placed in the carrier, and FIG. 3(c) is a side view of the carrier.

DETAILED DESCRIPTION OF THE INVENTION

Examples

Figure 2:
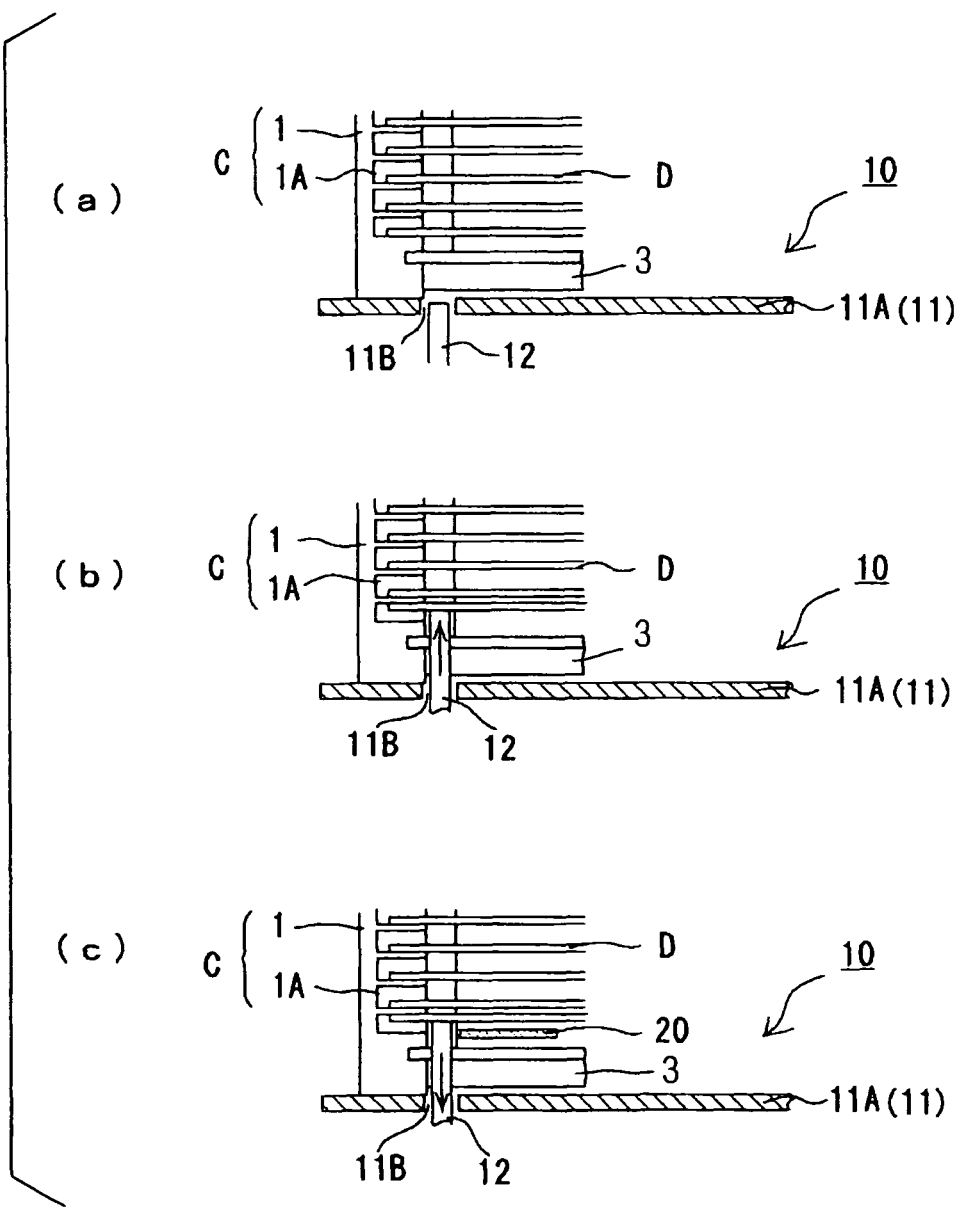
FIG. 2 is a longitudinal cross section showing a key portion, in the order of FIG. 2(a) to FIG. 2(c), of a process of carrying out a lowermost dicing frame in a carrier supported by the carrier supporting apparatus shown in FIG. 1.
Figure 3:
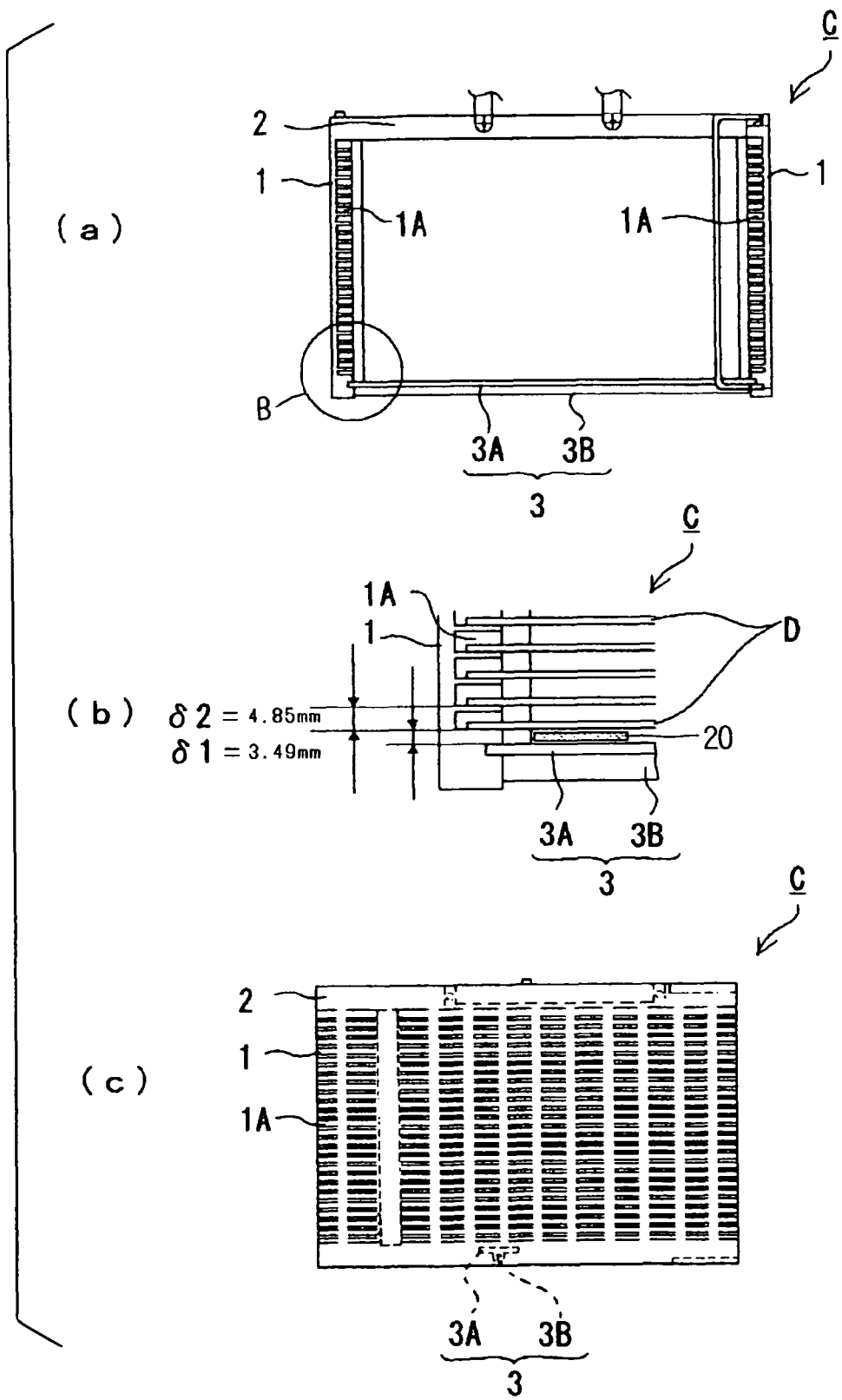

Hereinafter, a carrier supporting apparatus 10 as shown in FIGS. 1 and 2, for supporting a carrier C used exclusively for dicing frames as shown in FIG. 3, will be described as one embodiment of the present invention. Hereinafter, dicing frames corresponding to an 8-inch wafer and to a 6-inch wafer will be referred to as an 8-inch dicing frame and as a 6-inch dicing frame, respectively.

The carrier supporting apparatus 10 shown in FIGS. 1 and 2 includes a placing table 11 adapted for placing the carrier C thereon and a plurality of lifting members 12 each configured to be optionally raised and lowered relative to the placing table 11. In addition, the carrier supporting apparatus 10 includes drive mechanisms 13, 14 each provided in the placing table 11 and adapted to drive upwardly and downwardly the respective lifting members 12. The carrier supporting apparatus 10 is located, for example, in a loader chamber located adjacent a testing chamber in a probe system (not shown), constituting a part of the probe system. In this case, a carrying arm 20 (FIG. 2) for carrying each dicing frame D is provided in the loader chamber. The dicing frame D is supported by using the carrying arm 20, and is then carried between the carrier C and the testing chamber. In the testing chamber, wafer chips each held by the dicing frame D are checked for the electrical properties.

The carrier supporting apparatus 10 is configured to be adaptable to the carrier for containing 8-inch dicing frames therein as well as to the carrier for containing 6-inch dicing frames therein. Specifically, the carrier supporting apparatus 10 includes four lifting members 12 used for the 8-inch dicing frames and four lifting members 12 used for the 6-inch dicing frames.

Each lifting member 12 is provided as an elongated plate-like bar. In an upper portion of each lifting member 12, an elongated hole 12A (FIG. 1(b)) is formed to extend longitudinally. As shown in FIG. 1, each lifting member 12 can be raised and lowered due to lifting operations provided by the respective drive mechanisms 13, 14, such that its upper portion can be projected out and retracted into each slit-like opening 11B formed in an upper plate 11A of the placing table 11.

The drive mechanism 13 for driving the four lifting member 12 used for the 8-inch dicing frames includes an endless belt 13B, with which the lifting members 12 are respectively connected, and a cylinder mechanism 13C having a rod connected to the belt 13B. The endless belt 13B is provided along four pulleys 13A located at four corners of the placing table 11. With control of the operation of the cylinder mechanism 13C due to a controller (not shown), reciprocal rotations of the endless belt 13B can be achieved.

As shown in FIG. 1(b), a bottom end of each lifting member 12 is connected with the endless belt 13B via a shaft member 13D. In addition, a shaft member 13E crossing a longitudinally central portion of each opening 11B is provided to be fixed to the upper plate 11A. Each shaft member 13E extends through the elongated hole 12A of the corresponding lifting member 12 so as to provide relative guide to the lifting member 12.

A bearing 13H is attached to the shaft member 13D connecting the bottom end of each lifting member 12 with the endless belt 13B. Each bearing 13H is supported by a supporting member 13F such that it can be rolled horizontally. Each supporting member 13F is fixed to a plate member 13G, which is horizontally attached to an interior of the placing table 11. Each pulley 13A of the drive mechanism 13 is also attached to the plate member 13G.

With reciprocal rotations of the endless belt 13B, the four lifting members 12 are each swayed between an inclined state designated by a dashed line and a vertical state depicted by a sold line, at the same time, as such the top end can be projected out and retracted into each opening 11B. As shown in FIG. 2, when each lifting member 12 is projected out, to the greatest extent, from the opening 11B, in the vertical state, the lowermost dicing frame D contained in the carrier C is raised up to the possibly uppermost level.

As shown in FIG. 1(a), the drive mechanism 14 for the 6-inch dicing frames is provided inside the drive mechanism 13 for the 8-inch dicing frames. The drive mechanism 14 includes pulleys 14A, an endless belt 14B, and a cylinder mechanism 14C, which are all similar to those in the aforementioned drive mechanism 13. Since the configuration for driving each corresponding lifting member 12 due to the drive mechanism 14 is substantially similar to the configuration as depicted in FIG. 1(b), the description thereof is omitted here.

Although not shown, in the placing table 11, a clamp mechanism is provided, which is adapted to fix the carrier C positioned on the upper plate 11A via the guide rod 3 (FIGS. 1(b) and 3) to the upper plate 11A.

Next, operation of the carrier supporting apparatus 10 will be described, with reference to the case of using the carrier C for the 8-inch dicing frames, by way of example.

First, the carrier C is positioned on the placing table 11 of the carrier supporting apparatus 10 via the guide rod 3. Then, the carrier C is fixed onto the upper plate 11A of the placing table 11 due to the clamp mechanism. In the carrier C, 25 sheets of dicing frames D are contained. Upon checking the electrical properties of the dicing frames D, each dicing frame D is carried out from the carrier C and carried into the testing chamber, by using the carrying arm 20.

When taking out the dicing frame D other than the one supported on the lowermost stages of the carrier C, the carrying arm 20 can be directly inserted under each dicing frame D, thereby to support the dicing frame D, carry out it from the carrier C, and then carry it into the testing chamber, without any positional adjustment for the dicing frame D. On the other hand, when taking out the dicing frame D placed on the lowermost stages, it is difficult, as described above, to carry out the dicing frame without any positional adjustment thereof, because there is not a sufficient gap for inserting the carrying arm 20 between the dicing frame D and the guide rod 3.

To address this challenge, when carrying out the dicing frame D placed on the lowermost stages in the carrier C, the controller actuates the cylinder mechanism 13C of the drive mechanism 13. Once the cylinder mechanism 13C is actuated and a cylinder rod thereof is extended, the endless belt 13B is rotated in an anti-clockwise direction in FIG. 1(a). Consequently, the bottom end of each lifting member 12 is moved horizontally, as such the lifting member 12 rises gradually from the state as designated by the dashed line in FIG. 1(b) (or FIG. 2(a)). In this manner, each lifting member 12 rises completely, and its top end is projected upward from the opening 11B of the upper plate 11A of the placing table, thereby to push up a bottom face of the dicing frame D located on the lowermost stages in the carrier C. Thus, the dicing frame D supported on the lowermost set of supporting stages 1A, 1A in the carrier C can be gradually raised while keeping its horizontal attitude.

Once each lifting member 12 reaches the vertical state as depicted by the sold line in FIG. 1(b), the dicing frame D will abut the top faces of the lowermost grooves 1A, 1A as shown in FIG. 2(b) or will be stopped just prior to the abutment. Consequently, a sufficient gap can be secured for inserting the carrying arm 20 between the lowermost dicing frame D and the guide rod 3. Thereafter, the carrying arm 20 is advanced into the gap between the lowermost dicing frame D and the guide rod 3.

Subsequently, the controller actuate the cylinder mechanism 13C of the drive mechanism 13 to be moved in the reverse direction, so as to rotate the endless belt 13B in the clockwise direction in FIG. 1(a). As a result, each lifting member 12 is retracted into the opening 11B of the upper plate 11A of the placing table, as such the lowermost dicing frame D is placed on the carrying arm 20. Thereafter, the dicing frame D is carried out from the carrier C and carried into the testing chamber, by using the carrying arm 20.

The dicing frame D after tested is then returned onto the set of lowermost supporting stages 1A, 1A of the carrier C by using the carrying arm 20. At the time, a sufficient gap for inserting the carrying arm 20 therein is provided between the dicing frame D located on the second lowermost stages and the guide rod 3. Therefore, the dicing frame D having been located on the lowermost stages can be returned into the carrier C in the same manner as the operation for the other dicing frames D.

As stated above, according to the present invention, by using the plurality of lifting members 12 each vertically driven by the drive mechanisms 13, 14, the bottom face of the lowermost dicing frame D supported by the set of lowermost supporting stages 1A, 1A in the carrier C can be raised and lifted up from the set of lowermost supporting stages 1A, 1A. Thus, a sufficient gap for inserting the carrying arm 20 therein can be secured between the lowermost dicing frame D and the guide rod 3. Accordingly, even the lowermost dicing frame D in the carrier C can also be supported and carried out securely by using the carrying arm 20, without causing the carrying arm 20 and/or the dicing frame D to be damaged.

In addition, according to the present invention, for each lifting member 12, the shaft member 13E for guiding the lifting member 12 extends through its elongated hole 12A and is fixed to the upper plate 11A. Therefore, each lifting member 12 can be raised and lowered stably through the opening 11B formed in the upper plate 11A, while being guided relative to the upper plate 11A. Since the drive mechanisms 13, 14 includes the endless belts 13B, 14B to which the plurality of lifting members 12 are connected, and the cylinder mechanisms 13C, 14C connected to the endless belts 13B, 14B, respectively, each lifting member 12 can be securely driven to be raised and lowered in synchronism.

It should be appreciated that the present invention is not limited in any way to the embodiment described above. For example, the substantially plate-like object to be processed is not limited to the dicing frame, but may be a single semiconductor wafer or glass plate. Additionally, the drive mechanism for vertically driving each lifting member is not limited to the one employing the endless belt and the cylinder mechanism, but may be a system employing a cylinder mechanism directly connected with each lifting member.

The invention claimed is:

1. A carrier supporting apparatus for supporting a carrier containing, therein, a plurality of objects to be processed, such that each of said objects to be processed is arranged vertically at an interval in a horizontal attitude, the carrier including multiple sets of supporting stages each arranged vertically at an interval, a pair of left and right side plates, and a horizontal guide rod provided below the lowermost supporting stages for connecting the side plates, each set of the supporting stages being configured to support the periphery of a bottom face of one of said objects to be processed, and a gap between the lowermost supporting stages and the guide rod being narrower than a gap between each adjacent pair of the supporting stages, wherein the carrier supporting apparatus comprises:

a placing table adapted for placing the carrier thereon;

a lifting member provided such that the lifting member can be raised and lowered relative to the placing table and such that, when raised, the lifting member contacts a bottom face of only a lowermost object of the objects to be processed which is supported on the set of lowermost supporting stages in the carrier, the lifting member raising the lowermost object so as to lift up the bottom face thereof from the lowermost set of supporting stages; and a drive mechanism adapted to drive the lifting member to be raised and lowered, wherein the placing table has an upper plate having a slit-like opening formed therein, the lifting member is configured to be raised and lowered through the opening of the upper plate, and when the lifting member is projected out, to the greatest extent, through the slit-like opening, the lowermost object is raised up to a possibly uppermost level, thereby providing an enlarged gap between the bottom face of the lowermost object and guide rod, wherein the lifting member is swayed between an inclined state and a vertical state by the drive mechanism provided in the placing table, such that a top end thereof is projected out and retracted into the slit-like opening of the upper plate.

2. The carrier supporting apparatus according to claim 1, wherein an elongated hole is formed in the lifting member, and a shaft member extending through the elongated hole and adapted to guide the lifting member is provided.

3. The carrier supporting apparatus according to claim 1, wherein the carrier supporting apparatus comprises a plurality of lifting members, and the drive mechanism includes:
an endless belt, to which each lifting member is connected, and
a cylinder mechanism connected to the endless belt.

4. The carrier supporting apparatus according to claim 1, wherein
each object to be processed comprises a semiconductor wafer, a film onto which the semiconductor wafer is attached, and a dicing frame for supporting the film around the semiconductor wafer.

5. A carrying method for carrying out an object to be processed from a carrier containing, therein, a plurality of said objects to be processed, such that each object to be processed is arranged vertically at an interval in a horizontal attitude, the carrier including multiple sets of supporting stages each arranged vertically at an interval, a pair of left and right side plates, and a horizontal guide rod provided below a lowermost set of the supporting stages, each set of supporting stages being configured to support the periphery of a bottom face of one object to be processed, and a gap between the lowermost set of supporting stages and the guide rod being narrower than a gap between each adjacent pair of the supporting stages, the carrier is placed on a placing table which has an upper plate having a slit-like opening formed therein, wherein the carrier supporting method comprises the steps of:

projecting out a lifting member from the slit-like opening of the placing table;
lifting up only a lowermost object of the plurality of objects to be processed, from the lowermost set of supporting stages, by contacting the lifting member with a bottom face of only the lowermost object and raising the lowermost object by the lifting member to thereby provide an enlarged gap between the bottom face of the lowermost object and the guide rod;
driving a carrying arm to be advanced into the enlarged gap;
lowering and placing the lowermost object onto the carrying arm; and
carrying out the lowermost object from the carrier, by using the carrying arm,
wherein when the lifting member is projected out, to the greatest extent, through the slit-like opening, the lowermost object is raised up to a possibly uppermost level, and thereby providing the enlarged gap,
wherein the lifting member is swayed between an inclined state and a vertical state by a drive mechanism provided in the placing table, such that a to end thereof is projected out and retracted into the slit-like opening of the upper plate.

* * * * *